United States Patent [19]

Mathews et al.

[11] 3,947,771

[45] Mar. 30, 1976

[54] KEYED CLASSICAL AGC SYSTEM

[75] Inventors: James E. Mathews, Kokomo; Wayne A. Smith, Russiaville; Lester Wilkinson, Kokomo, all of Ind.

[73] Assignee: General Motors Corporation, Detroit, Mich.

[22] Filed: Feb. 21, 1975

[21] Appl. No.: 551,603

[52] U.S. Cl. .................. 325/404; 325/411; 325/319
[51] Int. Cl.² ................................................ H04B 1/16
[58] Field of Search .......... 325/319, 397, 399, 400, 325/401, 404, 405, 411, 413, 414

[56] References Cited
UNITED STATES PATENTS

| 3,115,547 | 12/1963 | Tschannen | 325/411 |
| 3,409,834 | 11/1968 | Cullis et al. | 325/404 |

*Primary Examiner*—Albert J. Mayer
*Attorney, Agent, or Firm*—Albert F. Duke

[57] ABSTRACT

An automatic gain control system in which a DC voltage proportional to an on-channel signal is used to control the gain of the RF stage but is keyed from the wide band output of the mixer stage to reduce the possibility of mixer overload.

2 Claims, 2 Drawing Figures

KEYED CLASSICAL AGC SYSTEM

This invention relates generally to automatic gain control of a signal amplifying system and more particularly to an automatic gain control system for a radio receiver.

Automobile FM receivers are often subject to many changing electromagnetic environments. Sometimes these changes in signal strength and signal distribution over the FM band produce unpleasant reception. For example, in a metropolitan area where many stations are only 800kHz. apart on the dial and physically only 5–10 miles apart in the city, intermodulation interference from mixer overload may occur. This results in a "flushing" of the station to which the listener is tuned and a "takeover" by a second stronger station with a third station in the background. The problem can be minimized by reducing the RF gain by perhaps 45dB so that the mixer does not see signals of such embarrassing magnitude as to cause intermodulation interference. So called "local/distance" switches have been provided in receivers for use by the listener in metropolitan areas prone to such intermodulation problems. However, when the switch is left in the "local" or low gain position the maximum stero signal-to-noise ratio obtained even with a very strong signal is 10–20dB less than is the case with the switch in the "distance" position. In short, when the switch is properly used by the listner a noticeable loss in singal-to-noise ratio results in the very area where reception from strong signals should be best.

Various automatic gain control (AGC) systems have been proposed which attempt to solve the problem of mixer overloading. Classical AGC systems respond to the on-channel signal to reduce the gain of the RF amplifier as the strength of the RF signal increases. Since a certain minimum signal level is required to fully quiet a stero receiver it is necessary under most listening conditions to delay the application of classical AGC to the RF stage until the minimum signal input is reached. Otherwise, the signal-to-noise ratio will suffer on strong signals. However, if the on-channel station is weak in comparison with adjacent stations, the delay in applying AGC may result in an overloading of the mixer and intermodulation distortion problems at least as great as those occurring in a non-AGC receiver.

In accordance with the present invention a classical AGC system is provided but the AGC is keyed from the wide band output of the mixer stage of the receiver. More specifically, the classical AGC voltage, developed as a function of the strength of the signal to which the receiver is tuned, is applied to a transmission gate which is controlled by a level detector which responds to the mixer output. Accordingly, under certain circumstances, for example, when the receiver is tuned to a strong station or is tuned to a weak station in the absence of strong signals in an adjacent channel, the AGC system functions in a manner to achieve the same results as the delayed classical AGC system. However, under circumstances where mixer overload conditions exist, i.e. when the receiver is tuned to a weak station and strong adjacent channel signals are present. The mixer output exceeds the threshold of the level detector and the AGC voltage is applied through the transmission gate to the RF stage. The amount of AGC voltage is, however, proportional to the strength of the on-channel signals so that the gain of the RF stage is not reduced to the point that the on-channel signal is flushed out as would be the case in a "wide band" AGC system which applies AGC voltage as a function of the wide band voltage.

It is an object of the present invention to provide an AGC system for a signal receiver which substantially alleviates the problem of mixer overload.

Further objects and advantages of the present invention will be more apparent from the following detailed description which should be read in conjunction with the accompanying drawings in which.

Figure 1:
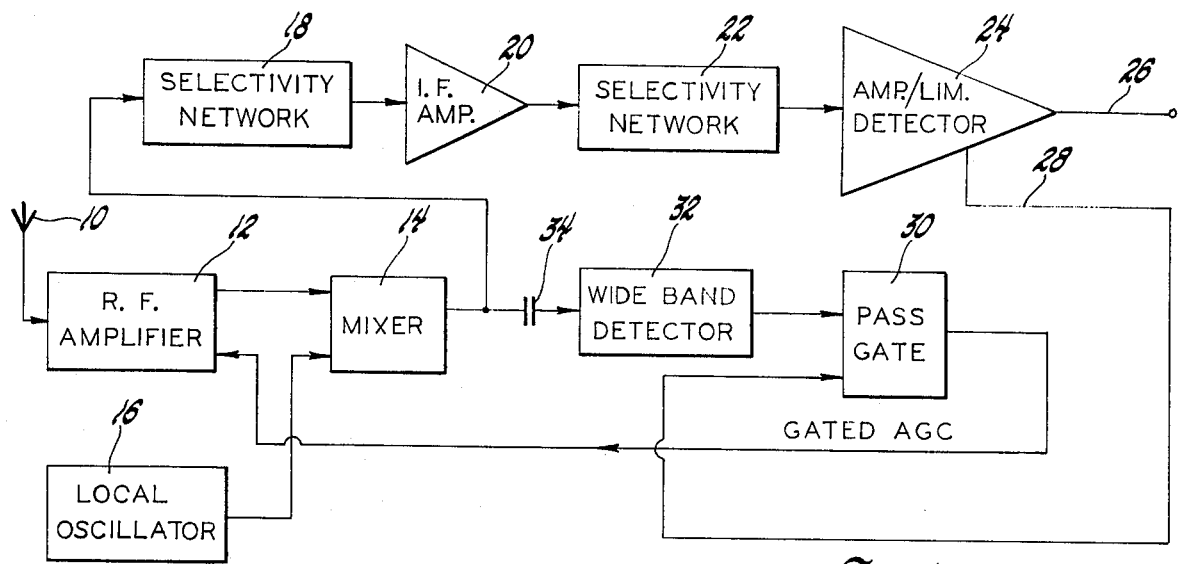
FIG. 1 is a block diagram depicting the present invention.

Referring now to the drawings and initially to FIG. 1, a radio signal picked up by antenna 10 is amplified by RF amplifier 12 and applied as a first input to mixer 14. Mixer 14 has the output of a local oscillator 16 applied to the second input thereto, which results in mixer 14 producing an IF signal output. A selectivity network 18, providing a band-pass characteristic appropriate to the particular receiver IF operating characteristics, couples the output from the mixer 14 to the input of an IF amplifier 20. A second selectivity network 22 further defining the IF band-pass, couples the IF signals from the amplifier 20 to an integrated circuit generally designated 24 which includes an amplifier-limiter section and quadrature detector section and provides an audio output on conductor 26 and a tuning meter output on conductor 28. A suitable integrated circuit is the RCA-CA3089E disclosed in Linear Integrated Circuit application note ICAN-6257 available on request from RCA Solid State Division, Box 3200, Summerville, N.J. The application note is incorporated herein. The circuit 24 further includes three peak detectors which are connected to successive ones of a three stage amplifier-limiter. The output on line 28 is the sum of the outputs of the three peak detectors and is a logarithmic DC output as a function of input signal. It will be understood, of course, that other circuit means may be utilized for producing the DC voltage on line 28 as long as the DC voltage produced is proportional to the strength of the on-channel signal. The voltage on line 28 provides one input to a pass gate 30, the other input of which is obtained from a wide band detector 32 which is coupled to the output of a mixer 14 through a capacitor 34. The output of the gate 30 controls the gain of the RF amplifier 12.

Figure 2:
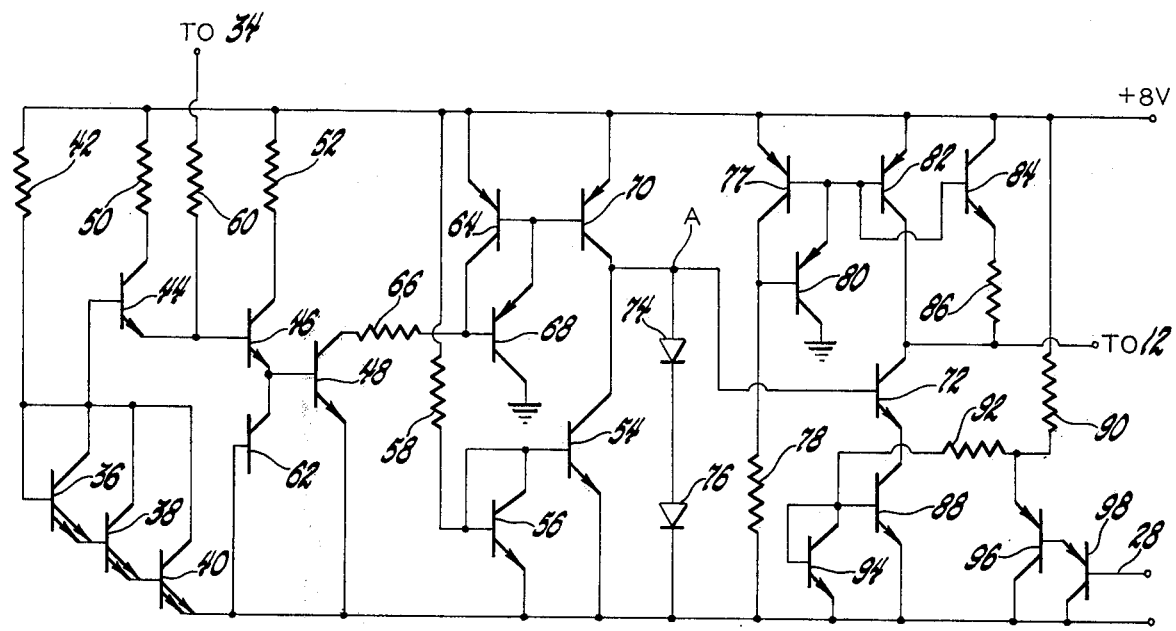
FIG. 2 is a schematic diagram of a preferred embodiment of the wide band detector and gate of FIG. 1.

Referring now to FIG. 2, the detector 32 includes diode-connected transistors 36, 38 and 40 and resistor 42 which form a biasing network for transistors 44, 46 and 48. Transistors 36, 38 and 40 have twice the emitter area of transistors 44, 46 and 48 and have a lower total $V_{be}$ drop relative to transistors 44, 46 and 48. Therefore, transistors 44, 46 and 48 carry one-half of the current carried by transistors 36, 38 and 40. Resistors 50 and 52 are provided in the collector circuits of transistors 44 and 46 for current limiting purposes. Transistor 54 and diode-connected transistor 56 and resistor 58 form a current sink which establishes an upper current limit at the collector of transistor 54. The output of the mixer 14 is applied through capacitor 34 and a resistor 60 to the base of transistor 46. When the AC signal from the mixer 14 exceeds the small $V_{be}$ difference between transistors 36, 38, 40 and 44, 46 and 48, the signal is fed to the base of transistor 48 through transistor 46 and charges an MOS capacitor 62. As capacitor 62 charges, transistor 48 conducts and draws current from transistor 64 through resistor 66. The current drawn by the transistor 48 is reflected by the transistors 64, 68 and 70 and appears at the collector of transistor 70. As long as the current at the collector of transistor 70 does not exceed the upper current limit for the transistor 54, the voltage at point A is low and gating transistor 72 is non-conductive. When the output of the mixer 14 is of sufficient strength to cause the current at the collector of transistor 70 to exceed the preset limit of the transistor 54 the voltage at point A goes high and transistor 72 is turned on. The voltage swing at the base of transistor 72 is limited by the diodes 74 and 76. A current level of approximately 50 microamps is established at the collector of transistor 77 by resistor 78. This current is reflected by the transistors 80 and 82. The transistor 84 is provided to permit the collector of transistor 82 to saturate to the 8 volt supply. The voltage to the RF amplifier 12 at the collector of transistor 72 will be approximately 8 volts until the current drawn by the transistor 72 exceeds the 50 microamps at the collector of transistor 82. When the current through the transistor 72 exceeds the preset level the voltage to the amplifier 12 will drop by the amount of excess current drawn through resistor 86. The current drawn through the transistor 72 is dependent on the voltage at the conductor 28. Transistor 88, resistors 90, 92, and diode connected transistor 94 form a current sink. The junction between resistors 90 and 92 is connected between PNP emitter follower transistors 96 and 98 due to the conductor 28. As the voltage on line 28 increases the current drawn by transistor 88 increases thereby lowering the voltage and reducing the gain of the RF amplifier 12. Accordingly, once the output of the mixer 14 exceeds the threshold level established by the detector 32 and turns on the transistor 72 a voltage inversely proportional to that appearing on conductor 28 is applied to the RF amplifier 12. Until the transistor 72 conducts, no AGC voltage is applied to amplifier 12.

Having thus described our invention, what we claim is:

1. In a signal receiver having an RF amplifier stage, a local oscillator, a mixer stage responsive to the outputs of said RF amplifier and said local oscillator for effecting a frequency conversion of a received signal, and means responsive to the output of said mixer stage for developing a DC voltage related to on-channel signal strength, the improvement comprising gate means for developing, when enabled, an AGC voltage proportional to said DC voltage, level detector means responsive to the output of said mixer for enabling said gate means only when the output of said mixer stage exceeds a predetermined threshold level, and means for applying said AGC voltage to said RF amplifier stage to reduce the gain thereof.

2. A signal receiver having an RF amplifier stage, a local oscillator, a mixer stage responsive to the output of said RF amplifier stage and said local oscillator, and means for developing a DC voltage for decreasing the gain of the RF stage with increasing on-station signal strength, a gating transistor having emitter, base and collector electrodes, means for applying a current proportional to said DC voltage to the emitter of said gating transistor, level detector means responsive to the voltage output of said mixer for controlling the base electrode of said gating transistor whereby said gating transistor is rendered conductive when said mixer output exceeds a predetermined threshold level, means for applying a voltage proportional to the collector current of said gating transistor to said RF amplifier to decrease the gain thereof.

* * * * *